United States Patent
Shindo et al.

(10) Patent No.: US 12,381,094 B2
(45) Date of Patent: Aug. 5, 2025

(54) SUBSTRATE PROCESSING APPARATUS AND SUBSTRATE PROCESSING METHOD

(71) Applicant: Tokyo Electron Limited, Tokyo (JP)

(72) Inventors: Naoki Shindo, Nirasaki (JP); Ryo Kuwajima, Nirasaki (JP); Hirofumi Yamaguchi, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 17/656,315

(22) Filed: Mar. 24, 2022

(65) Prior Publication Data
US 2022/0319877 A1    Oct. 6, 2022

(30) Foreign Application Priority Data
Mar. 30, 2021  (JP) ................. 2021-058396

(51) Int. Cl.
*H01L 21/67*  (2006.01)
*C23C 16/455*  (2006.01)
*H01L 21/3065*  (2006.01)

(52) U.S. Cl.
CPC .. *H01L 21/67069* (2013.01); *C23C 16/45557* (2013.01)

(58) Field of Classification Search
CPC .............. H01L 21/67069; H01L 21/3065
See application file for complete search history.

(56) References Cited

U.S. PATENT DOCUMENTS

| | | | |
|---|---|---|---|
| 5,884,009 A * | 3/1999 | Okase | H01L 21/67017 392/416 |
| 2004/0216671 A1* | 11/2004 | Carpenter | C23C 16/45544 118/728 |
| 2005/0268856 A1* | 12/2005 | Miller | C23C 16/45519 118/729 |
| 2011/0027480 A1* | 2/2011 | Han | C23C 16/45565 427/248.1 |
| 2011/0290419 A1* | 12/2011 | Horiguchi | H01J 37/32834 118/723 E |
| 2012/0048180 A1* | 3/2012 | Ito | C30B 25/10 117/88 |
| 2016/0189987 A1* | 6/2016 | Amikura | H01L 21/67069 156/345.29 |
| 2017/0069470 A1* | 3/2017 | Murakami | H01J 37/32541 |
| 2017/0362713 A1* | 12/2017 | Karim | C23C 16/4408 |

FOREIGN PATENT DOCUMENTS

| | | |
|---|---|---|
| JP | 6541374 B2 | 7/2019 |
| JP | 2020-161596 A | 10/2020 |

* cited by examiner

*Primary Examiner* — Parviz Hassanzadeh
*Assistant Examiner* — Margaret Klunk
(74) *Attorney, Agent, or Firm* — Armstrong Teasdale LLP (57) ABSTRACT

A substrate processing apparatus for processing a substrate includes: a processing container in which the substrate is accommodated; a stage provided in an interior of the processing container and configured to place the substrate thereon; a partition wall provided in the interior of the processing container and surrounding an outer circumference of the stage; an inner gas supplier configured to supply a first gas to an inner side of the partition wall; and an outer gas supplier configured to supply a second gas to an outer side of the partition wall in the interior of the processing container.

7 Claims, 5 Drawing Sheets

| | Time (sec) | Temp (deg.C) | Press (Torr) | Inner | | | Outer | Gas Total (sccm) | E/R (nm/min) |
| --- | --- | --- | --- | --- | --- | --- | --- | --- | --- |
| | | | | No.1 Gas (sccm) | No.2 Gas (sccm) | N2 Gas (sccm) | N2 Gas (sccm) | | |
| Example | 30 | 300 | 90 | 390 | 420 | 66 | 410 | 1286 | 43.7 |
| Comparative Example | 30 | 300 | 90 | 390 | 420 | 476 | 0 | 1286 | 37.4 |

SUBSTRATE PROCESSING APPARATUS AND SUBSTRATE PROCESSING METHOD

CROSS-REFERENCE TO RELATED APPLICATION

This application is based upon and claims the benefit of priority from Japanese Patent Application No. 2021-058396, filed on Mar. 30, 2021, the entire contents of which are incorporated herein by reference.

TECHNICAL FIELD

The present disclosure relates to a substrate processing apparatus and a substrate processing method.

BACKGROUND

Patent Document 1 discloses a substrate processing apparatus that performs desired processing on a substrate with a processing gas under a vacuum atmosphere. The substrate processing apparatus includes a chamber, a substrate stage, a gas introduction member, and a partition wall member. The gas introduction member introduces a gas containing the processing gas into the chamber. The partition wall member forms a partition wall that defines a processing space in a region including the substrate above the substrate stage.

PRIOR ART DOCUMENT

Patent Document

Patent Document 1: Japanese Laid-Open Patent Publication No. 6541374

SUMMARY

According to one embodiment of the present disclosure, a substrate processing apparatus for processing a substrate includes: a processing container in which the substrate is accommodated; a stage provided in an interior of the processing container and configured to place the substrate thereon; a partition wall provided in the interior of the processing container and surrounding an outer circumference of the stage; an inner gas supplier configured to supply a first gas to an inner side of the partition wall; and an outer gas supplier configured to supply a second gas to an outer side of the partition wall in the interior of the processing container.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

In a semiconductor device manufacturing process, various processes such as an etching process and a film forming process are performed on a semiconductor wafer (a substrate, hereinafter referred to as a "wafer")) using a processing gas under a vacuum atmosphere (under a depressurized atmosphere).

In the substrate processing apparatus disclosed in Patent Document 1 described above, for example, when an etching process is performed on the wafer, the processing gas is introduced from the gas introduction member into the processing space in the inner side of the partition wall defined by the partition wall member. However, since the inner side and outer side of the partition wall communicate with each other, some of the processing gas supplied to the inner side of the partition wall also flows out to the outer side of the partition wall during the etching process, and thus the processing gas diffuses in the entire interior of the chamber including the inner side and the outer side of the partition wall. In so doing, since a partial pressure (concentration) of the processing gas becomes low, the processing gas cannot be used effectively, and the etching rate decreases. As a result, the processing time of the etching process increases. In addition, the consumption of the processing gas required to achieve the desired etching is also increased. In particular, for example, when etching a metal film formed on the wafer, an expensive gas may be used as the processing gas, and thus it is required to reduce the consumption of the processing gas.

The technique according to the present disclosure efficiently performs substrate processing using a processing gas. Hereinafter, a wafer processing apparatus and a wafer processing method as the substrate processing apparatus and the substrate processing method according to the present embodiment will be described with reference to the drawings. In this specification and the drawings, elements having substantially the same functional configurations will be denoted by the same reference numerals and redundant descriptions thereof will be omitted.

<Wafer Processing Apparatus>

Figure 1:
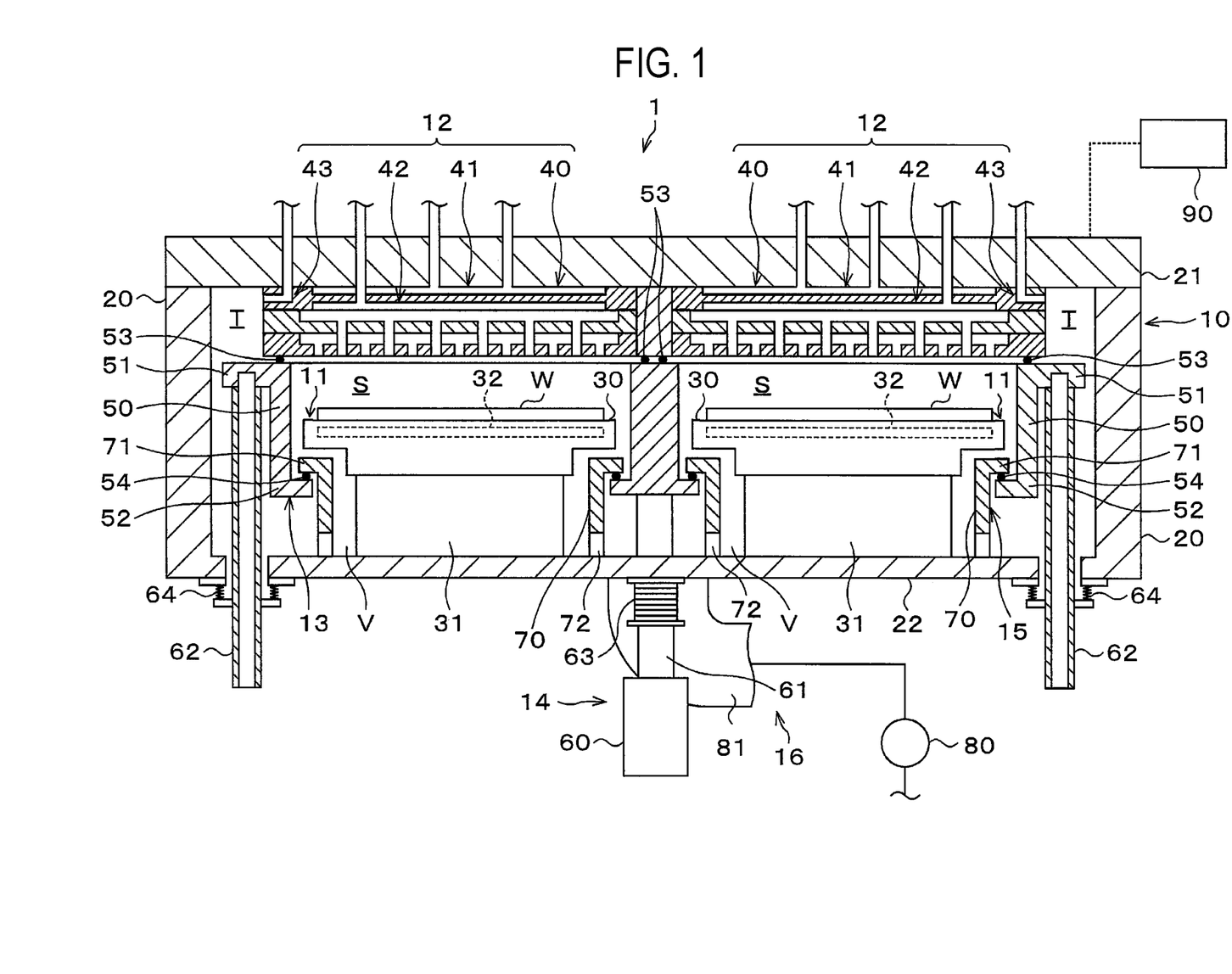
FIG. 1 is a vertical cross-sectional view schematically illustrating a configuration of a wafer processing apparatus according to an embodiment.

First, the wafer processing apparatus according to the present embodiment will be described. FIG. 1 is a vertical cross-sectional view illustrating an outline of a configuration of a wafer processing apparatus 1. In the wafer processing apparatus 1, an etching process is performed on a wafer W as a substrate. A film to be subjected to the etching process is not particularly limited, but is, for example, a metal film formed on the wafer W.

As illustrated in FIG. 1, the wafer processing apparatus 1 includes an airtight processing container 10, a plurality of stages (in the present embodiment, two stages 11) each configured to place a wafer W thereon inside the processing container 10, gas suppliers 12 configured to supply a processing gas and an inert gas into the processing container 10, a partition wall 13 surrounding the outer periphery of the stages 11 and configured to be capable of being raised and lowered, a lifting mechanism 14 fixed to the bottom surface of the processing container 10 and configured to raise and lower the partition wall 13, inner walls 15 individually surrounding the outer side of each of the stages 11, and an exhaust part 16 configured to evacuate the interior of the processing container 10.

The processing container 10 is a substantially rectangular parallelepiped container as a whole, which is formed of a metal such as aluminum or stainless steel. The processing container 10 has, for example, a substantially rectangular shape in a plan view, and includes a cylindrical sidewall 20 having open top and bottom sides, a ceiling plate 21 that hermetically covers the top side of the sidewall 20, and a bottom plate 22 that covers the bottom side of the sidewall 20. In addition, a seal member (not illustrated) is provided between the upper end surface of the sidewall 20 and the ceiling plate 21 so as to hermetically maintain the interior of the processing container 10. In addition, the processing container 10 is provided with a heater (not illustrated). The bottom plate 22 may be provided with a heat insulating material.

Each stage 11 is formed in a substantially cylindrical shape, and includes an upper stage 30 including a placement surface on which the wafer W is placed, and a lower stage 31 fixed to the bottom plate 22 and supporting the upper stage 30. A temperature adjusting mechanism 32 for adjusting the temperature of the wafer W is built in the upper stage 30. The temperature adjusting mechanism 32 adjusts the temperature of the stage 11 by circulating a coolant such as water to control the temperature of the wafer W on the stage 11 to a desired temperature.

In the bottom plate 22, a support pin unit (not illustrated) is provided at a position below each stage 11, and is configured to be capable of delivering the wafer W between a support pin (not illustrated) driven upward and downward by the support pin unit and a transfer mechanism (not illustrated) provided outside the wafer processing apparatus 1.

The gas suppliers 12 include shower heads 40 provided above the stages 11. Each gas supplier 12 includes a first inner gas supplier 41 configured to supply, for example, a processing gas (first gas) to the inner side of the partition wall 13, a second inner gas supplier 42 configured to supply an inert gas (e.g., $N_2$ gas in the present embodiment) to the inner side of the partition wall 13, and an outer gas supplier 43 configured to supply, for example, an inert gas (second gas) ($N_2$ gas in the present embodiment) to the outer side of the partition wall 13. The first inner gas supplier 41, the second inner gas supplier 42, and the outer gas supplier 43 are provided in each of the shower heads 40. A detailed configuration of the gas supplier 12 will be described later.

The partition wall 13 includes two cylindrical portions 50 that individually surround the two stages 11, respectively, upper flanges 51 provided at upper ends of the cylindrical portions 50, respectively, and lower flanges 52 provided at lower ends of the cylindrical portions 50, respectively. An inner diameter of each cylindrical portion 50 is set to be larger than an outer surface of the stage 11, and a gap is formed between the cylindrical portion 50 and the stage 11.

A heater (not illustrated) is provided on the partition wall 13 to heat the partition wall 13 to a desired temperature. Due to this heating, foreign matter contained in the processing gas is prevented from adhering to the partition wall 13.

On top surfaces of the upper flanges 51, for example, seal members 53 such as, for example, O-rings, are provided to correspond to respective stages 11 so as to hermetically block spaces between the upper flanges 51 and the shower heads 40 when the upper flanges 51 and the shower heads 40 are brought into contact with each other by raising the partition wall 13 by the lifting mechanism 14. In addition, on protrusions 71 of inner walls 15 which will be described later, seal members 54 such as O-rings, for example, are also provided to correspond to respective stages 11 so as to hermetically block spaces between the protrusions 71 and the lower flanges 52 when the protrusions 71 and the lower flanges 52 are brought into contact with each other. In addition, by raising the partition wall 13 to bring the shower heads 40 and the seal members 53 into contact with each other and further to bring the lower flanges 52 and the seal members 54 into contact with each other, the interior of the processing container 10 is partitioned by the partition wall 13. That is, in the interior of the processing container 10, an inner space S, which is a space inside the partition wall 13, and an outer space T, which is a space outside the partition wall 13, are formed.

The lifting mechanism 14 configured to raise and lower the partition wall 13 includes an actuator disposed outside the processing container 10, a drive shaft 61 connected to the actuator 60 and extending vertically upward inside the processing container 10 through the bottom plate 22 of the processing container 10, and a plurality of guide shafts 62 connected to the partition wall 13 at tip ends thereof and extending to the exterior of the processing container 10 at the other ends thereof. The guide shafts 62 prevent the partition wall 13 from being tilted when the partition wall 13 is raised or lowered by the drive shaft 61.

An extendable bellows 63 is hermetically connected to the drive shaft 61 at the lower end portion thereof. The upper end portion of the bellows 63 is hermetically connected to the bottom surface of the bottom plate 22. Therefore, when the drive shaft 61 is raised and lowered, the bellows 63 expands and contracts in the vertical direction so that the interior of the processing container 10 is hermetically maintained. In addition, between the drive shaft 61 and the bellows 63, for example, a sleeve (not illustrated) fixed to the bottom plate 22 is provided to function as a guide during the raising and lowering operation.

An extendable bellows 64 is connected to each of the guide shafts 62 as in the drive shaft 61. In addition, the upper end portion of the bellows 64 is hermetically connected to both the bottom plate 22 and the sidewall 20. Therefore, when the guide shafts 62 are raised and lowered with the raising and lowering operation of the partition wall 13 by the drive shaft 61, each bellows 64 extends and contracts in the vertical direction so that the interior of the processing container 10 is hermetically maintained. Sleeves (not illustrated) that function as a guide during the raising and lowering operation are also provided respectively between the guide shafts 62 and the bellows 64 as in the case of the drive shaft 61.

The inner walls 15 are made of, for example, a metal such as aluminum. Each inner wall 15 includes a substantially cylindrical main body 70 and a protrusion 71 provided at the upper end of the main body 70 and protruding horizontally toward the outer peripheral direction of the inner wall 15. The inner walls 15 are disposed to individually surround the lower stages 31 of the stages 11, respectively. An inner diameter of each of the main bodies 70 of the inner walls 15 is set to be larger than an outer diameter of each of the lower stages 31, and thus exhaust spaces V are formed between the inner walls 15 and the lower stages 31. In the present embodiment, the exhaust spaces V also include spaces between the partition wall 13 and the upper stages 30. As illustrated in FIG. 1, a height of each of the inner walls 15 is set such that the seal members 54 and the protrusions 71 of the inner walls 15 are brought into contact with each other when the partition wall 13 is raised to a wafer processing position by the lifting mechanism 14. As a result, the inner walls 15 and the partition wall 13 are brought into hermetic contact with each other.

A plurality of slits 72 are formed in the lower ends of the inner walls 15. The slits 72 are exhaust ports through which a processing gas is discharged. In the present embodiment, the slits 72 are formed at substantially equal intervals along the circumferential directions of the inner walls 15.

The inner walls 15 are fixed to the bottom plate 22. As described above, the processing container 10 is configured to be heated by a heater (not illustrated), and the inner walls 15 are also heated by the heater of the processing container 10. The inner walls 15 are heated to a desired temperature so that foreign matter contained in the processing gas does not adhere to the inner walls 15.

The exhaust part 16 includes an exhaust mechanism 80 configured to evacuate the interior of the processing container 10. The exhaust mechanism 80 is connected to an exhaust pipe 81 provided in the outer side of the partition wall 13 and the inner walls 15 in the bottom plate 22 of the processing container 10. The exhaust mechanism 80 and the exhaust pipe 81 are commonly provided to the two inner walls 15. That is, the processing gas from the two exhaust spaces V is exhausted by the exhaust mechanism 80 through the common exhaust pipe 81.

The wafer processing apparatus 1 described above is provided with a controller 90. The controller 90 is a computer including, for example, a CPU and a memory, and includes a program storage (not illustrated). The program storage stores programs for controlling processing of the wafer W in the wafer processing apparatus 1. The programs may be recorded in a computer-readable storage medium (not illustrated) and may be installed on the controller 90 from the storage medium. In addition, the storage medium may be a transitory or non-transitory storage medium.

<Gas Supplier>

Figure 2:
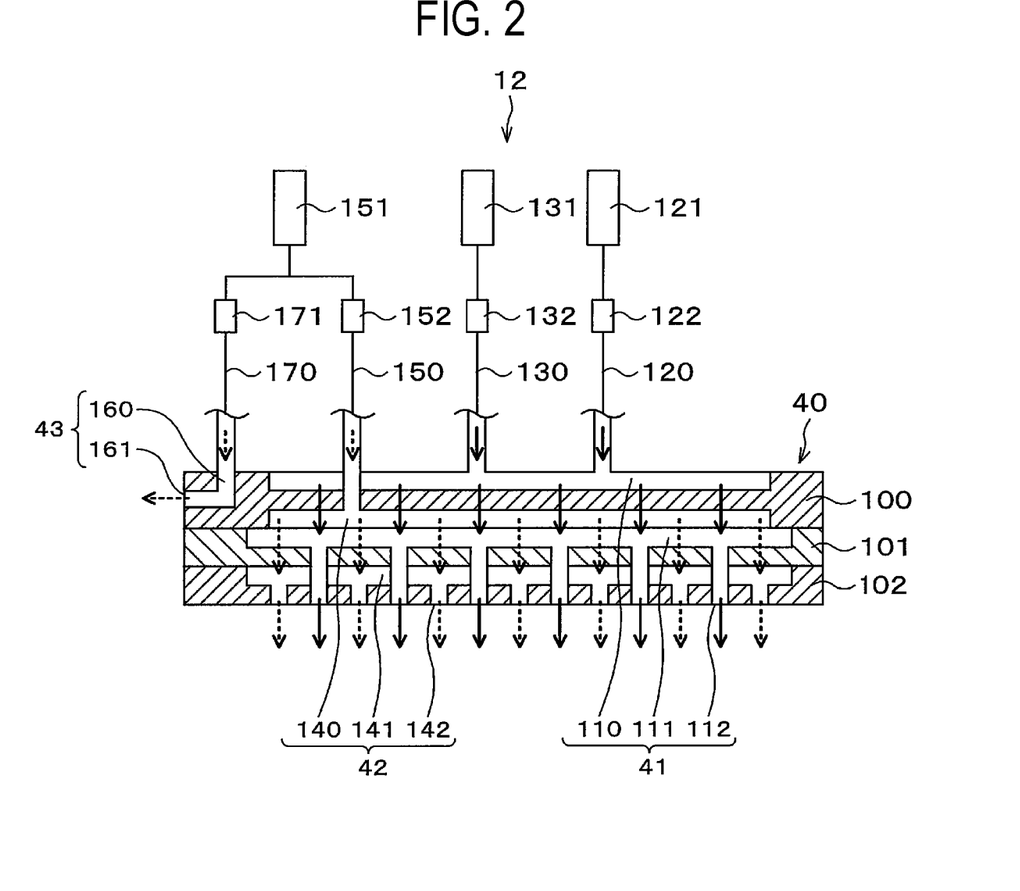
FIG. 2 is an explanatory view illustrating an outline of a configuration of a gas supplier according to an embodiment.

Next, the configuration of the above-described gas supplier 12 will be described. FIG. 2 is an explanatory view schematically illustrating an outline of the configuration of the gas supplier 12.

As illustrated in FIG. 2, the gas supplier 12 includes two shower heads 40. The two shower heads 40 are individually provided on the bottom surface of the ceiling plate 21 of the processing container 10 to face the stages 11. Each shower head 40 is provided with the above-described first inner gas supplier 41, second inner gas supplier 42, and outer gas supplier 43. FIG. 2 illustrates only one of the two shower heads 40, and also illustrates the first inner gas supplier 41, the second inner gas supplier 42, and the outer gas supplier 43 one by one.

The shower head 40 has a configuration in which an upper layer plate 100, an intermediate layer plate 101, and a lower layer plate 102 (so-called shower plates) are stacked in this order from the top side. The upper layer plate 100, the intermediate layer plate 101, and the lower layer plate 102 are each made of, for example, aluminum.

The first inner gas supplier 41 supplies a processing gas to the inner side (inner space S) of the partition wall 13 (solid line arrows in the drawing). The first inner gas supplier 41 includes an upper diffusion space 110 formed in the upper layer plate 100, a lower diffusion space 111 formed in the intermediate layer plate 101, and a plurality of supply ports 112 formed on the lower surface of the lower layer plate 102. The upper diffusion space 110 is formed such that the processing gas diffuses over the entire surface on the top surface side of the upper layer plate 100. The lower diffusion space 111 communicates with the upper diffusion space 110 and is formed such that the processing gas diffuses over the entire surface on the top surface side of the intermediate layer plate 101. The plurality of supply ports 112 communicate with the lower diffusion space 111 and are formed to be uniformly distributed on the bottom surface of the lower layer plate 102.

A first processing gas supply pipe 120 is connected to the upper diffusion space 110. The first processing gas supply pipe 120 is connected to a first processing gas source 121. The first processing gas supply pipe 120 is provided with a gas supply device 122 including a valve, a mass flow controller, and the like.

A second processing gas supply pipe 130 is connected to the upper diffusion space 110. The second processing gas supply pipe 130 is connected to a second processing gas source 131. The second processing gas supply pipe 130 is provided with a gas supply device 132 including a valve, a mass flow controller, and the like.

A first processing gas and a second processing gas are stored in the interior of the first processing gas source 121 and the interior of the second processing gas source 131, respectively. As the first processing gas and the second processing gas, a gas corresponding to a film to be etched is used.

Each of the first processing gas supplied from the first processing gas source 121 and the second processing gas supplied from the second processing gas source 131 flows into the upper diffusion space 110, and the first and second processing gases are mixed and diffuse in the upper diffusion space 110. The mixed processing gas flows into and diffuses in the lower diffusion space 111. Then, the mixed processing gas is supplied to the inner side of the partition wall 13 (the inner space S) from the plurality of supply ports 112.

The second inner gas supplier 42 supplies an inert gas ($N_2$ gas in the present embodiment) (dotted line arrows in the drawing) to the inner side of the partition wall 13 (the inner space S). The inert gas supplied from the second inner gas supplier 42 is not limited to the $N_2$ gas, and may be, for example, an Ar gas or a He gas.

The second inner gas supplier 42 includes an upper diffusion space 140 formed in the upper layer plate 100, a lower diffusion space 141 formed in the lower layer plate 102, and a plurality of supply ports 142 formed in the bottom surface of the lower layer plate 102. The upper diffusion space 140 is formed such that the $N_2$ gas diffuses over the entire surface on the bottom surface side of the upper layer plate 100. The lower diffusion space 141 is formed to communicate with the upper diffusion space 140 so that the $N_2$ gas diffuses over the entire surface on the top surface side of the lower layer plate 102. The plurality of supply ports 142 communicate with the lower diffusion space 141 and are formed to be uniformly distributed on the bottom surface of the lower layer plate 102.

A $N_2$ gas supply pipe 150 is connected to the upper diffusion space 140. The $N_2$ gas supply pipe 150 is connected to a $N_2$ gas source 151. The $N_2$ gas supply pipe 150 is provided with a gas supply device 152 including a valve, a mass flow controller, and the like. The $N_2$ gas is stored in the interior of the $N_2$ gas source 151.

The $N_2$ gas supplied from the $N_2$ gas source 151 flows into and diffuses in the upper diffusion space 140, and further flows into and diffuses in the lower diffusion space 141. Then, the $N_2$ gas is supplied to the inner side of the partition wall 13 (the inner space S) from the plurality of supply ports 142.

The outer gas supplier 43 supplies an inert gas ($N_2$ gas in the present embodiment) (dotted line arrows in the drawing) to the outer side of the partition wall 13 (the outer space T). The inert gas supplied from the outer gas supplier 43 is not limited to the $N_2$ gas, and may be, for example, an Ar gas or a He gas.

The outer gas supplier 43 includes a diffusion space 160 formed in the upper layer plate 100 and a plurality of supply ports 161 formed in the side surface of the upper layer plate 100. The diffusion space 160 is formed such that the $N_2$ gas diffuses to the outer peripheral portion on the top surface side of the upper layer plate 100. The plurality of supply ports 161 communicate with the diffusion space 160 and are formed at equal intervals in the circumferential direction on the side surface of the upper layer plate 100.

A $N_2$ gas supply pipe 170 is connected to the diffusion space 160. The $N_2$ gas supply pipe 170 is connected to the $N_2$ gas source 151. The $N_2$ gas supply pipe 170 is provided with a gas supply device 171 including a valve, a mass flow controller, and the like. The $N_2$ gas supply pipe 170 may be connected to a $N_2$ gas source different from the $N_2$ gas source 151.

The $N_2$ gas supplied from the $N_2$ gas source 151 flows into and diffuses in the diffusion space 160. Then, the $N_2$ gas is supplied to the outer side of the partition wall 13 (the outer space T) from the plurality of supply ports 161.

The first processing gas source 121, the second processing gas source 131, and the $N_2$ gas source 151 may be commonly provided to the two shower heads 40, or may be individually provided for each shower head 40.

<Etching Process>

Next, an etching process in the wafer processing apparatus 1 configured as described above will be described. FIGS. 3A to 4B are explanatory views of an etching process. In the present embodiment, a metal film formed on the wafer W is etched.

(Step S1)

Figure 3A:
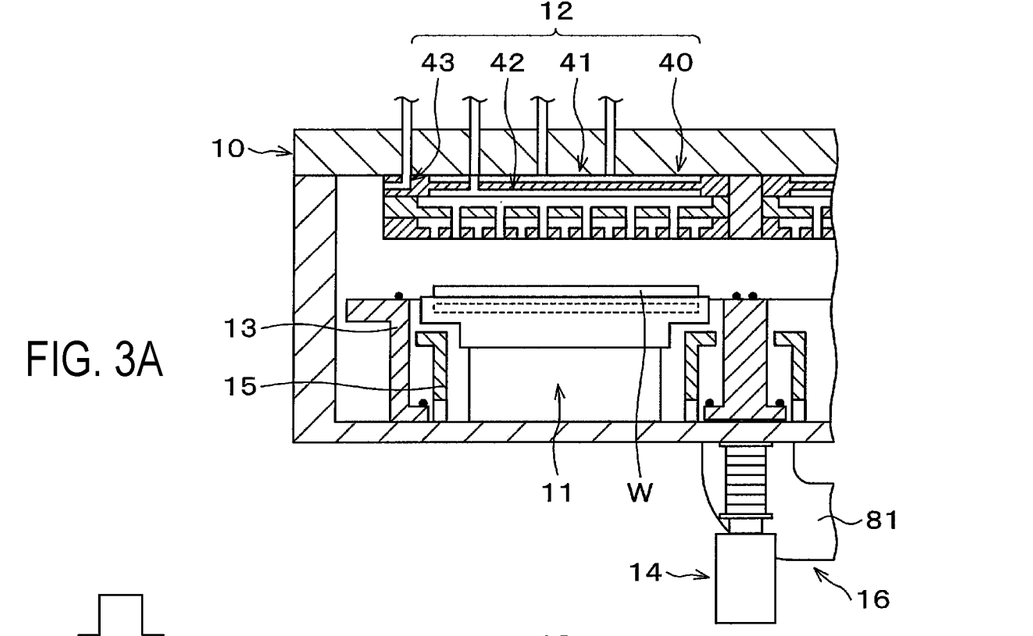
FIGS. 3A and 3B are explanatory views of an etching process in an embodiment.

First, as illustrated in FIG. 3A, the wafer W is transferred into the processing container 10 in a state in which the partition wall 13 is lowered to a retracted position, and is placed on each stage 11. The retracted position of the partition wall 13 is set such that the top surface of the upper flange 51 is located below the top surface of the stage 11.

(Step S2)

Figure 3B:
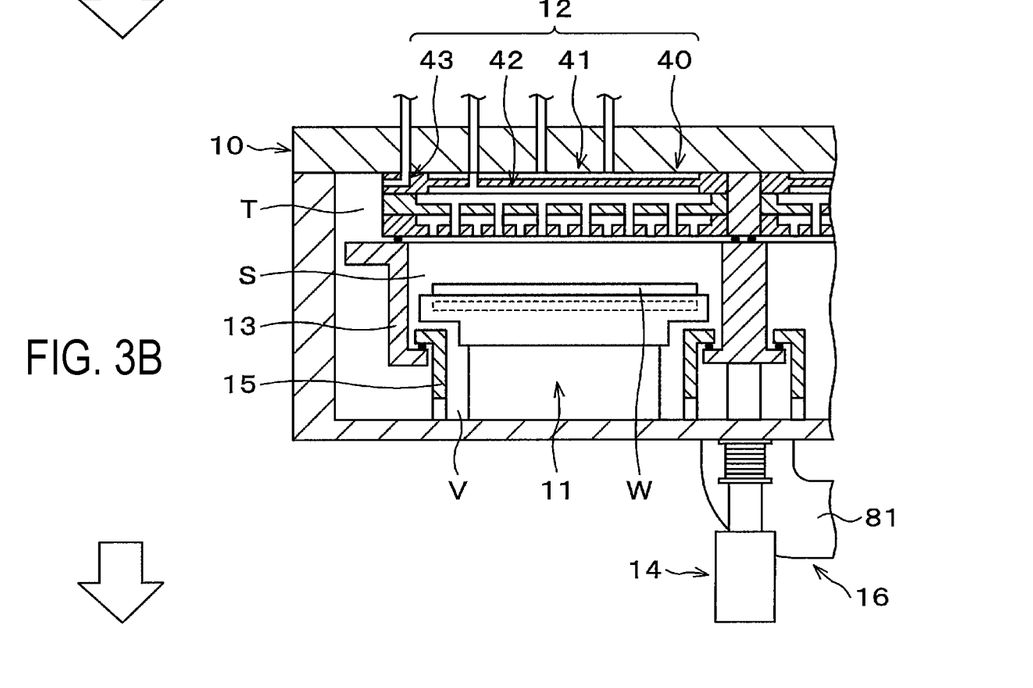

Subsequently, as illustrated in FIG. 3B, the partition wall 13 is raised to a processing position. The processing position of the partition wall 13 is a position at which the upper flange 51 is brought into contact with the shower head 40. As a result, the interior of the processing container 10 is partitioned by the partition wall 13, so that the inner space S in the inner side of the partition wall 13 and the outer space T in the outer side of the partition wall 13 are formed.

(Step S3)

Figure 4A:
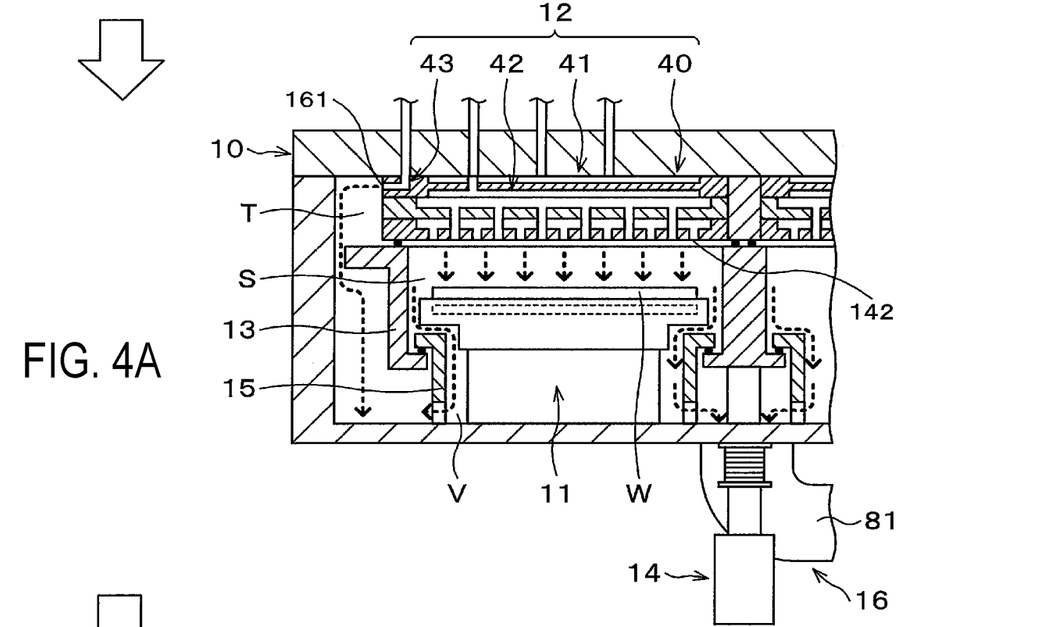
FIGS. 4A and 4B are explanatory views of the etching process in the embodiment.

Subsequently, as illustrated in FIG. 4A, the $N_2$ gas (dotted line arrows in the drawing) is supplied from the supply ports 161 of the outer gas supplier 43 to the outer space T, and the $N_2$ gas (dotted line arrows in the drawing) is supplied to the inner space S from the supply ports 142 of the second inner gas supplier 42. Then, an internal pressure of the outer space T and an internal pressure of the inner space S are adjusted. At this time, the internal pressure of the inner space S is adjusted to be a positive pressure relative to the internal pressure of the outer space T.

(Step S4)

Figure 4B:
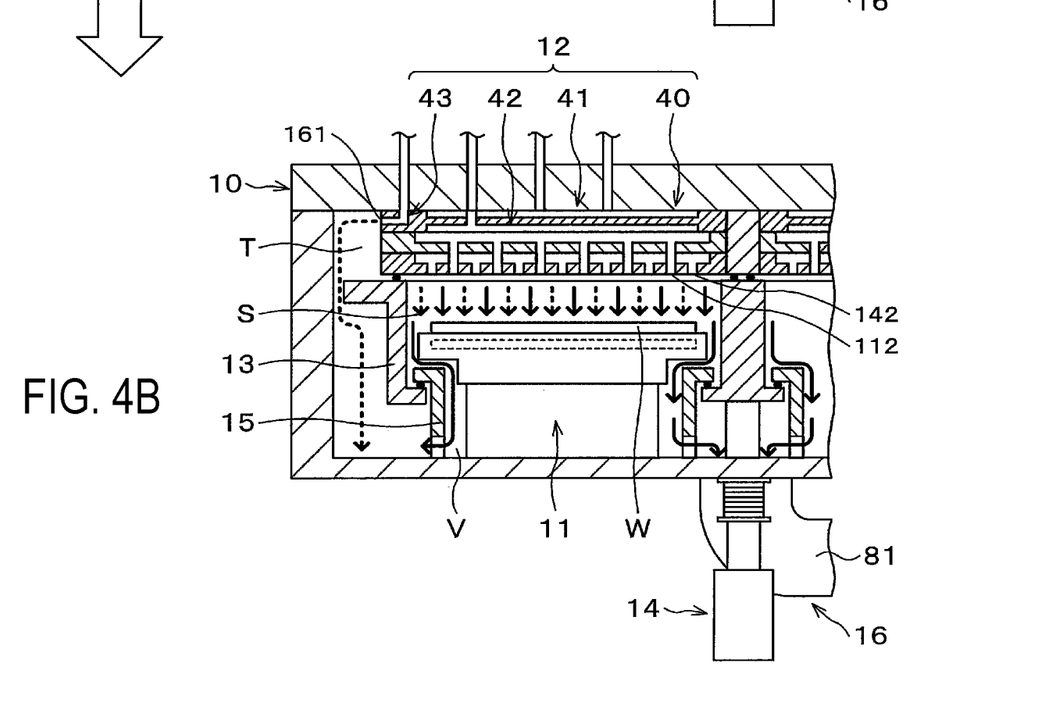

Subsequently, as illustrated in FIG. 4B, the supply of the $N_2$ gas (dotted line arrows in the drawing) from the supply ports 161 of the outer gas supplier 43 to the outer space T is continued. In addition, the processing gas (the mixed processing gas, solid line arrows in the drawing) is supplied from the supply ports 112 of the first inner gas supplier 41 to the inner space S, and the $N_2$ gas (dotted line arrows in the drawing) is supplied to the inner space S from the supply ports 142 of the second inner gas supplier 42. Then, the metal film on the wafer W is etched by the processing gas.

In step S4, the $N_2$ gas is supplied to the outer space T. As a result, it is possible to prevent the processing gas in the inner space S from flowing out into the outer space T.

In step S4, the internal pressure of the inner space S is maintained to be equal to the internal pressure of the outer space T or to be a positive pressure relative to the internal pressure of the outer space T. As a result, it is possible to suppress the backflow of the $N_2$ gas from the outer space T to the inner space S.

In step S4, by supplying the $N_2$ gas from the supply ports 142 of the second inner gas supplier 42, it is possible to suppress the backflow of the processing gas from the supply port 142 from the inner space S.

In step S4, the processing gas and the $N_2$ gas inside the inner space S are discharged by the exhaust mechanism 80 from the outer periphery of the wafer W placed on the stage 11 through the exhaust space V and the slits 72 in the inner wall 15 and through the exhaust pipe 81. In addition, the $N_2$ gas inside the outer space T is also discharged by the exhaust mechanism 80 through the exhaust pipe 81. Since the exhaust pipe 81 is provided in the outer side of the partition wall 13, it is possible to further suppress the backflow of the $N_2$ gas from the outer space T to the inner space S.

When the etching process in step S4 is completed, the partition wall 13 is lowered to the retracted position, and the wafer W on each stage 11 is carried out to the outside of the wafer processing apparatus 1. In this way, a series of wafer processing processes is terminated.

According to the above embodiment, by supplying the $N_2$ gas to the outer space T in step S4, it is possible to suppress flowing-out of the processing gas in the inner space S to the outer space T and diffusion of the processing gas over the entire interior of the processing container 10. That is, it is possible to keep the diffusion space of the processing gas small, and thus to increase the partial pressure (concentration) of the processing gas in the inner space S. As a result, since it is possible to effectively use the processing gas, the etching rate can be improved. This makes it possible to reduce the processing time of the etching process so that the productivity of a product wafer can be improved. It is also possible to reduce the consumption of a processing gas required to achieve desired etching. In particular, when etching a metal film formed on the wafer W as in the present embodiment, it is possible to suppress the running cost of the etching process by reducing the consumption of the processing gas since an expensive gas may be used as the processing gas.

In order to verify the effect of the present embodiment, the present inventors conducted an experiment using the wafer processing apparatus 1. In this experiment, as an example, in step S4, the $N_2$ gas was supplied to the outer space T, and an etching process was performed as in the present embodiment. As a comparative example, an etching process was performed without supplying the $N_2$ gas to the outer space T.

Figure 5:
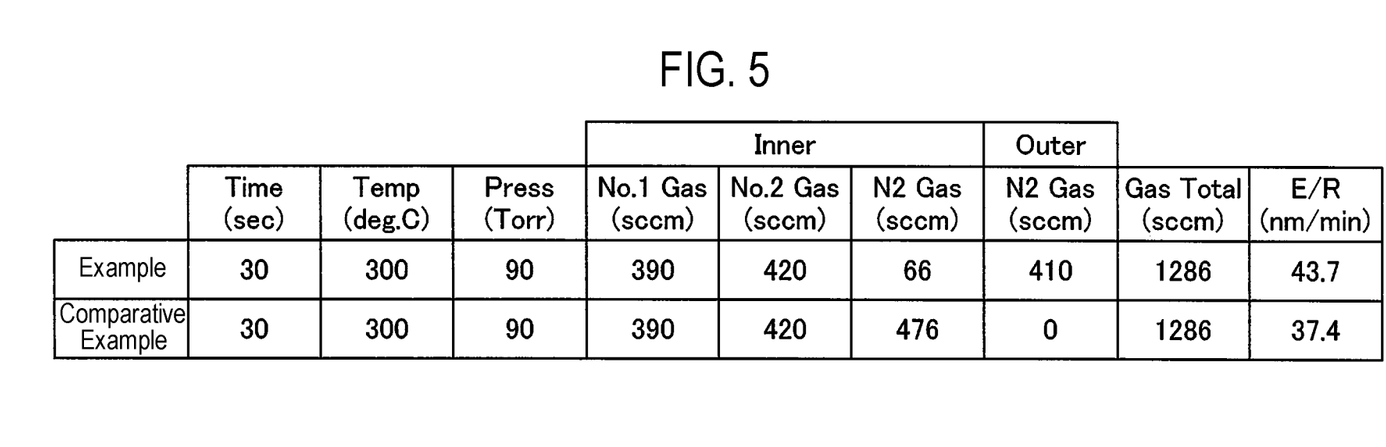
FIG. 5 is a table showing results of verifying effects of the embodiment.

FIG. 5 shows experimental conditions and experimental results of the present embodiment. Etching process times, temperatures, and pressures are the same in the example and the comparative example, respectively. In addition, in the example and the comparative example, the total flow rates of the gas supplied to the interior of the processing container 10 are the same, and the flow rates of the first processing gas supplied to the inner space S and the flow rates of the second processing gas are also the same. In the example, the $N_2$ gas was supplied to each of the inner space S and the outer space T, whereas in the comparative example, the $N_2$ gas was supplied only to the inner space S and no $N_2$ gas was supplied to the outer space T.

In such a case, referring to FIG. 5, the etching rate in the comparative example is low. It is presumed that this is because the processing gas supplied to the inner space S flowed out to the outer space T and diffused over the entire interior of the processing container 10, so the partial pressure (concentration) of the processing gas became low. On the other hand, in the example, the etching rate is higher than that in the comparative example. This is because, since the $N_2$ gas was supplied to the outer space T, it was possible to suppress the flowing-out of the processing gas from the inner space S to the outer space T, and thus it was possible to increase the partial pressure (concentration) of the processing gas. In addition, the increase in the concentration of the processing gas in the inner space S due to the decrease in the flow rate of the $N_2$ gas supplied to the inner space S also contributes to the improvement of the etching rate. Therefore, the effects of the above-described embodiment were verified through this experiment.

Other Embodiments

In the above-described embodiment, the internal pressure of the processing container 10 is adjusted in step S3 after raising the partition wall 13 in step S2, but the order of these steps S2 and S3 may be reversed. In the case in which the internal pressure of the processing container 10 in step S3 is adjusted using the $N_2$ gas from the outer gas supplier 43 and the $N_2$ gas from the second inner gas supplier 42, the internal pressure may be adjusted in the state in which the partition wall 13 is lowered to the retracted position, and then the partition wall 13 may be raised to the processing position in step S2.

When the internal pressure of the processing container 10 is adjusted in step S3, the processing gas may be supplied from the first inner gas supplier 41 or the second inner gas supplier 42. For example, when a metal film on the wafer W is oxidized to etch the metal film, an oxygen-containing gas is used as one of processing gases, but this oxygen-containing gas may be supplied in the pressure adjustment in step S3. In such a case, in order to suppress the flowing-out of the oxygen-containing gas supplied to the inner side of the partition wall 13 to the outer side of the partition wall 13, it is preferable to adjust the internal pressure of the processing container 10 in step S3 after raising the partition wall 13 in step S2.

In the above-described embodiment, the $N_2$ gas is supplied from the plurality of supply ports 161 formed in the side surface of the shower heads 40 in the outer gas suppliers 43, but the supply position of the $N_2$ gas is not limited thereto. For example, when the shower head 40 greatly extends in the horizontal direction to the outer side of the partition wall 13, the plurality of supply ports 161 may be formed in the bottom surface of the shower heads 40, and the $N_2$ gas may be supplied vertically downward toward the outer side of the partition wall 13 from the plurality of supply ports 161.

In the above-described embodiment, the description has been made based on an example in which two stages 11 are provided as a plurality of stages, but the number of installed stages 11 is not limited to two. For example, a single stage 11 may be provided, or three or more stages 11 may also be provided.

In the above-described embodiment, the partition wall 13 is configured to be capable of being raised or lowered by the lifting mechanism 14, but the partition wall may be fixed. This partition wall is fixedly provided on the bottom surface of the shower head 40 and the bottom surface of the processing container 10. In addition, on the side surface of the partition wall, a carry-in/out port for carrying in/out the wafer W may be formed, and a shutter for opening/closing the carry-in/out port may be provided. In such a case, the inner wall 15 may be omitted.

In the above-described embodiment, a single partition wall 13 is provided for two stages 11, but the structure of the partition wall is not limited to the content of the present embodiment. The shape of the partition wall may be arbitrarily set as long as the partition wall can form an independent inner space S for each stage 11. As an example, the partition wall may be provided individually for each stage 11.

In the above-described embodiment, the case in which the metal film on the wafer W is etched in the wafer processing apparatus 1 has been described, but the film to be etched is not limited thereto. In the above-described embodiment, the case in which the etching process is performed in the wafer processing apparatus 1 has been described, but wafer processing to which the present disclosure is applied is not limited thereto. The present disclosure may be applied to, for example, a film forming process as long as the film forming process is wafer processing using a processing gas.

According to the present disclosure, substrate processing using a processing gas can be efficiently performed.

The embodiments disclosed herein should be considered to be exemplary in all respects and not restrictive. The above-described embodiments may be omitted, replaced, or modified in various forms without departing from the scope and spirit of the appended claims.

What is claimed is:

1. A substrate processing apparatus for processing a substrate, comprising:
    a processing container in which the substrate is accommodated;
    a stage provided in an interior of the processing container and configured to place the substrate thereon;
    a partition wall provided in the interior of the processing container and surrounding an outer circumference of the stage;
    an inner gas supplier configured to supply a first gas to an inner side of the partition wall;
    an outer gas supplier including a diffusion space and a plurality of supply ports in communication with the diffusion space, the plurality of supply ports configured to supply a second gas only to an outer side of the partition wall in the interior of the processing container without supplying the second gas to the inner side to prevent the first gas in the inner side from flowing out into the outer side; and a controller configured to control the inner gas supplier and the outer gas supplier, wherein the first gas is supplied to the inner side of the partition wall and the second gas is supplied to the outer side of the partition wall such that a pressure in the inner side of the partition wall is adjusted to be equal to or larger than a pressure in the outer side of the partition wall, wherein the first gas is a processing gas and the second gas is a first inert gas, wherein the inner gas supplier includes a first inner gas supplier configured to supply the processing gas, and a second inner gas supplier configured to supply a second inert gas, and wherein the controller performs adjusting the pressure in the inner side to be greater than the pressure in the outer side using the first inert gas and the second inert gas before supplying the processing gas.

2. The substrate processing apparatus of claim 1, wherein the inner gas supplier and the outer gas supplier are provided in a same shower head.

3. The substrate processing apparatus of claim 1, further comprising:
an exhaust pipe provided on a bottom surface of the processing container in the outer side of the partition wall and configured to evacuate the interior of the processing container.

4. The substrate processing apparatus of claim 3, further comprising:
a lifting actuator configured to raise and lower the partition wall.

5. The substrate processing apparatus of claim 1, further comprising:
an exhaust pipe provided on a bottom surface of the processing container in the outer side of the partition wall and configured to evacuate the interior of the processing container.

6. The substrate processing apparatus of claim 1, further comprising:
a lifting actuator configured to raise and lower the partition wall.

7. A substrate processing apparatus for processing a substrate, comprising:
a processing container in which the substrate is accommodated;
a partition wall configured to partition an interior of the processing container;
a shower head configured to supply a gas to the interior of the processing container, and
a controller,
wherein the shower head is partitioned by the partition wall into a region in which a first gas is supplied to an inner side of the partition wall and a region in which a second gas is supplied to an outer side of the partition wall in the interior of the processing container,
wherein the second gas is supplied only to the outer side of the partition wall without being supplied to the inner side through a plurality of supply ports in communication with a diffusion space to prevent the first gas in the inner side from flowing out into the outer side,
wherein the first gas is supplied to the inner side of the partition wall and the second gas is supplied to the outer side of the partition wall such that a pressure in the inner side of the partition wall is adjusted to be equal to or larger than a pressure in the outer side of the partition wall,
wherein the first gas is a processing gas and the second gas is a first inert gas,
wherein a second inert gas is further supplied to the inner side of the partition wall, and
wherein the controller performs adjusting the pressure in the inner side to be greater than the pressure in the outer side using the first inert gas and the second inert gas before supplying the processing gas.

* * * * *